United States Patent
Ding et al.

(10) Patent No.: US 7,768,762 B2
(45) Date of Patent: Aug. 3, 2010

(54) DESIGN STRUCTURE FOR AN ON-CHIP HIGH FREQUENCY ELECTRO-STATIC DISCHARGE DEVICE

(75) Inventors: Hanyi Ding, Essex Junction, VT (US); Kai D. Feng, Hopewell Jct., NY (US); Zhong-Xiang He, Essex Junction, VT (US); Xuefeng Liu, South Burlington, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 159 days.

(21) Appl. No.: 12/144,084

(22) Filed: Jun. 23, 2008

(65) Prior Publication Data

US 2009/0316313 A1 Dec. 24, 2009

(51) Int. Cl.
*H02H 7/20* (2006.01)
*H02H 9/00* (2006.01)
(52) U.S. Cl. .......................... 361/112; 361/56; 313/243
(58) Field of Classification Search ................. 361/112; 313/243
See application file for complete search history.

(56) References Cited

U.S. PATENT DOCUMENTS

| | | | |
|---|---|---|---|
| 4,531,176 A | 7/1985 | Beecher, II | |
| 5,697,799 A | 12/1997 | Consoli et al. | |
| 5,990,519 A | 11/1999 | Huang-Lu et al. | |
| 6,121,954 A | 9/2000 | Seffernick | |
| 6,204,549 B1 | 3/2001 | Igel et al. | |
| 6,406,948 B1 | 6/2002 | Jun et al. | |
| 6,515,488 B1 | 2/2003 | Thomas | |
| 6,661,576 B2 | 12/2003 | Pinto | |
| 6,826,828 B1 | 12/2004 | Shen | |
| 6,916,188 B2 | 7/2005 | Lang et al. | |
| 7,196,406 B2 | 3/2007 | Kuzmenka | |
| 7,256,976 B2 | 8/2007 | Sato | |
| 7,295,590 B2 | 11/2007 | Crews | |
| 7,535,105 B2 * | 5/2009 | Voldman | 257/758 |
| 2009/0091233 A1 * | 4/2009 | Te-Pang | 313/243 |

OTHER PUBLICATIONS

Ding et al., U.S. Appl. No. 12/144,089, filed Jun. 23, 2008, Notice of Allowance and Fee(s) Due dated Mar. 10, 2010, 11 pages.

* cited by examiner

*Primary Examiner*—Stephen W Jackson
*Assistant Examiner*—Dharti H Patel
(74) *Attorney, Agent, or Firm*—Anthony J. Canale; Hoffman Warnick LLC

(57) ABSTRACT

A design structure for an on-chip high frequency electro-static discharge device is described. In one embodiment, the electro-static discharge device comprises a substrate and multiple metal level layers disposed on the substrate. Each metal level comprises more than one electrode formed therein and more than one via connecting with some of the electrodes in adjacent metal levels. The device further includes a gap formed about one of the metal level layers, wherein the gap is hermetically sealed to provide electro-static discharge protection for the integrated circuit.

20 Claims, 13 Drawing Sheets

US 7,768,762 B2

DESIGN STRUCTURE FOR AN ON-CHIP HIGH FREQUENCY ELECTRO-STATIC DISCHARGE DEVICE

CROSS REFERENCE TO RELATED APPLICATIONS

This patent application relates to commonly-assigned U.S. patent application Ser. No. 12/144,071 entitled "METHOD FOR FORMING AN ON-CHIP HIGH FREQUENCY ELECTRO-STATIC DISCHARGE DEVICE", Ser. No. 12/144,089 entitled "METHOD FOR FORMING AN ON-CHIP HIGH FREQUENCY ELECTRO-STATIC DISCHARGE DEVICE", and Ser. No. 12/144,095 entitled "DESIGN STRUCTURE FOR AN ON-CHIP HIGH FREQUENCY ELECTRO-STATIC DISCHARGE DEVICE", all filed concurrently with this application.

FIELD OF THE INVENTION

This disclosure relates generally to integrated circuit design, and more specifically to a design structure for an electro-static discharge device fabricated on an integrated circuit.

BACKGROUND

As electronic components get smaller and smaller along with the internal structures in integrated circuits, it is becoming easier to either completely destroy or otherwise impair electronic components. In particular, many integrated circuits are highly susceptible to damage from the discharge of static electricity. Electro-static discharge (ESD) is the transfer of an electro-static charge between bodies at different electro-static potentials (voltages), caused by direct contact or induced by an electro-static field. The discharge of static electricity, or ESD, has become a critical problem for the electronics industry.

Device failures that result from ESD events are not always immediately catastrophic or apparent. Often, the device is only slightly weakened but is less able to withstand normal operating stresses and hence, may result in a reliability problem. Therefore, various ESD protection circuits must be included in the device to protect the various components.

Typical ESD protection circuits use an on-chip diode based ESD protection. These on-chip diode ESD devices work well for lower frequency currents but at higher frequency circuits such as millimeter wave circuits, these ESD protection circuits severely impair the performance of the millimeter wave circuits because of its inability to ameliorate the large parasitic capacitance that arises during the high operating frequency.

One approach that has been contemplated for overcoming the problems associated with using an on-chip diode ESD device for millimeter wave circuits is to use a matching circuit for ESD protection. However, the use of a matching circuit for ESD protection is a high risk solution because almost all matching circuits comprise inductances. Problems can arise when a high ESD current flows through the circuit. In particular, when a high ESD current flows through the circuit, the inductance generates high voltage which can damage input and output circuits.

SUMMARY

In one embodiment, there is an electro-static discharge protection device fabricated on an integrated circuit. In this embodiment, the electro-static discharge protection device comprises a substrate and multiple metal level layers disposed on the substrate. Each metal level comprises more than one electrode formed therein and more than one via connecting with some of the electrodes in adjacent metal levels. The device further includes a gap formed about one of the metal level layers, wherein the gap is hermetically sealed to provide electro-static discharge protection for the integrated circuit.

In a second embodiment, there is a design structure of an on-chip electro-static discharge protection device embodied in a machine readable medium. In this embodiment, the design structure of the electro-static discharge protection device comprises a substrate; multiple metal level layers disposed on the substrate wherein each metal level comprises more than one electrode formed therein and more than one via connecting with some of the electrodes in adjacent metal levels; and a gap formed about one of the metal level layers, wherein the gap is hermetically sealed to provide electro-static discharge protection for the integrated circuit.

DETAILED DESCRIPTION

Figure 1:
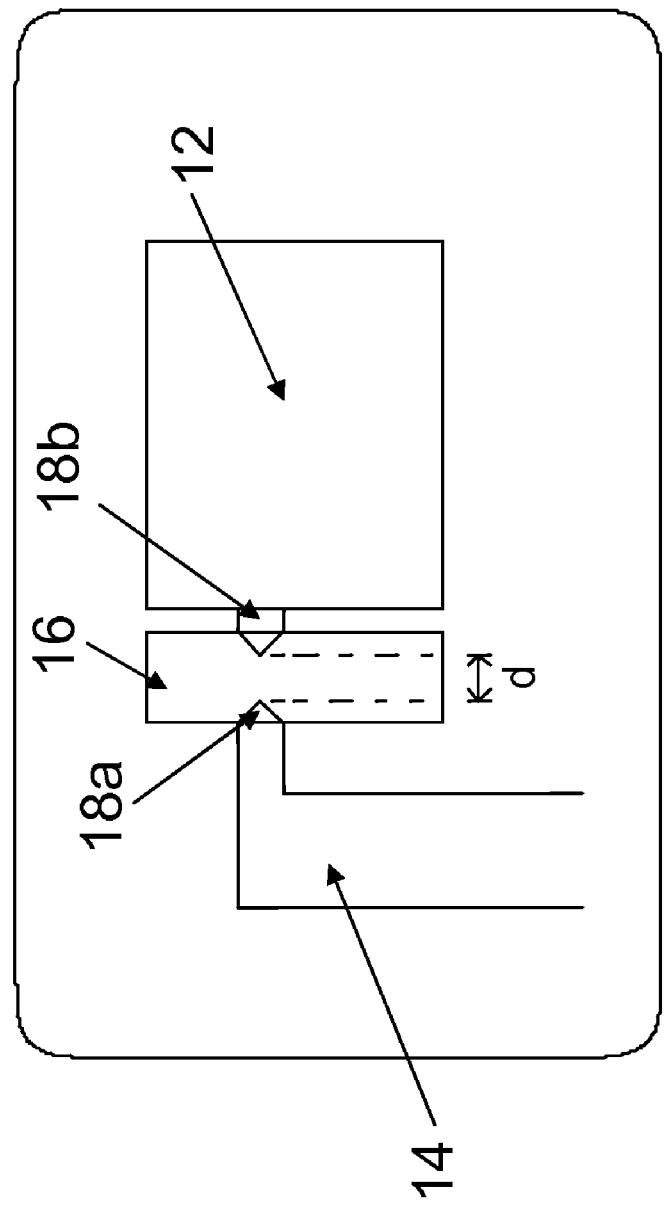
FIG. 1 shows a top-down view of an electro-static discharge device according to one embodiment of the disclosure.

FIG. 1 shows a top-down view of an electro-static discharge (ESD) device 10 according to one embodiment of the disclosure. As shown in FIG. 1, the ESD device 10 comprises a pad 12 which connects to components of a circuit such as a high frequency (e.g., a millimeter wave) circuit (not shown). A metal wire 14, separated by a gap 16, is adjacent to the pad 12. The metal wire 14 is a wire in the high frequency circuit (not shown) that is grounded by a substrate in the circuit (not shown). The gap 16 can be a vacuum gap or an air gap. Tips 18a and 18b protrude from the pad 12 and the metal wire 14, respectively, into the gap 16. Tips 18a and 18b can be made of copper, aluminum, tungsten or the like. As shown in FIG. 1, tips 18a and 18b have sharp tips and are separated from each other in the gap 16 by a distance denoted by d. Because the size of tips 18a and 18b can be designed to be as small as a minimum metal line width defined by a design rule, the parasitic capacitance can be ignored. Those skilled in the art will recognize that tips 18a and 18b can take on different shapes and that the distance d can vary depending on the amount of protection desired to ameliorate high voltage events (i.e., the distance d determines the ESD clamping voltage).

An ESD event (e.g., a high voltage) will enter the device 10 through the pad 12 (the pad is connected to the outside world) towards tips 18a and 18b. When the voltage applied to tips 18a and 18b exceeds the clamping voltage, a discharge occurs in the tips through the air gap such that the high voltage event is grounded through the metal wire 14 to the substrate. During the discharge, resistance is very low which keeps the voltage between the tips very low so that the underlying circuit can be protected. When the voltage is lower than the clamping voltage, then the discharge is over and tips 18a and 18b are resumed isolated.

Figure 2:
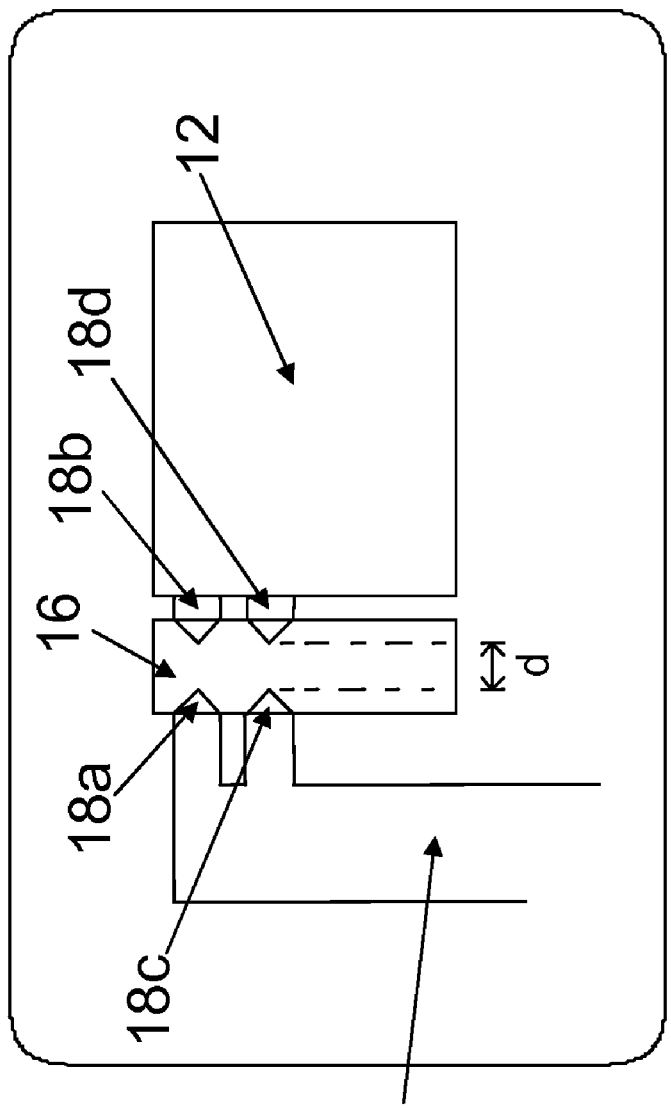
FIG. 2 shows a top-down view of an electro-static discharge device according to a second embodiment of the disclosure.

Those skilled in the art will recognize that the ESD device 10 shown in FIG. 1 is only one possible embodiment of implementing this concept and that other implementations are possible. For example, FIG. 2 shows a top-down view of an ESD device 19 according to a second embodiment of the disclosure. In particular, the ESD device 19 includes multiple tips 18a, 18b, 18c, and 18d. The ESD device 19 operates in a manner similar to the ESD device 10, except that multiple tips are used to discharge high voltage events. Although four tips are shown in FIG. 2, those skilled in the art will recognize that this only illustrative and that any reasonable number of tips can be used.

FIGS. 3-8 show the general process flow of forming an ESD device depicted in FIGS. 1 and 2 according to one embodiment of this disclosure. In particular, FIGS. 3-8 generally pertain to a process of forming ESD device 10 depicted in FIG. 1, however, the description is suitable for fabricating ESD device 19. Those skilled in the art will recognize that forming ESD device 19 will require additional steps to produce the extra tips.

Figure 3A:
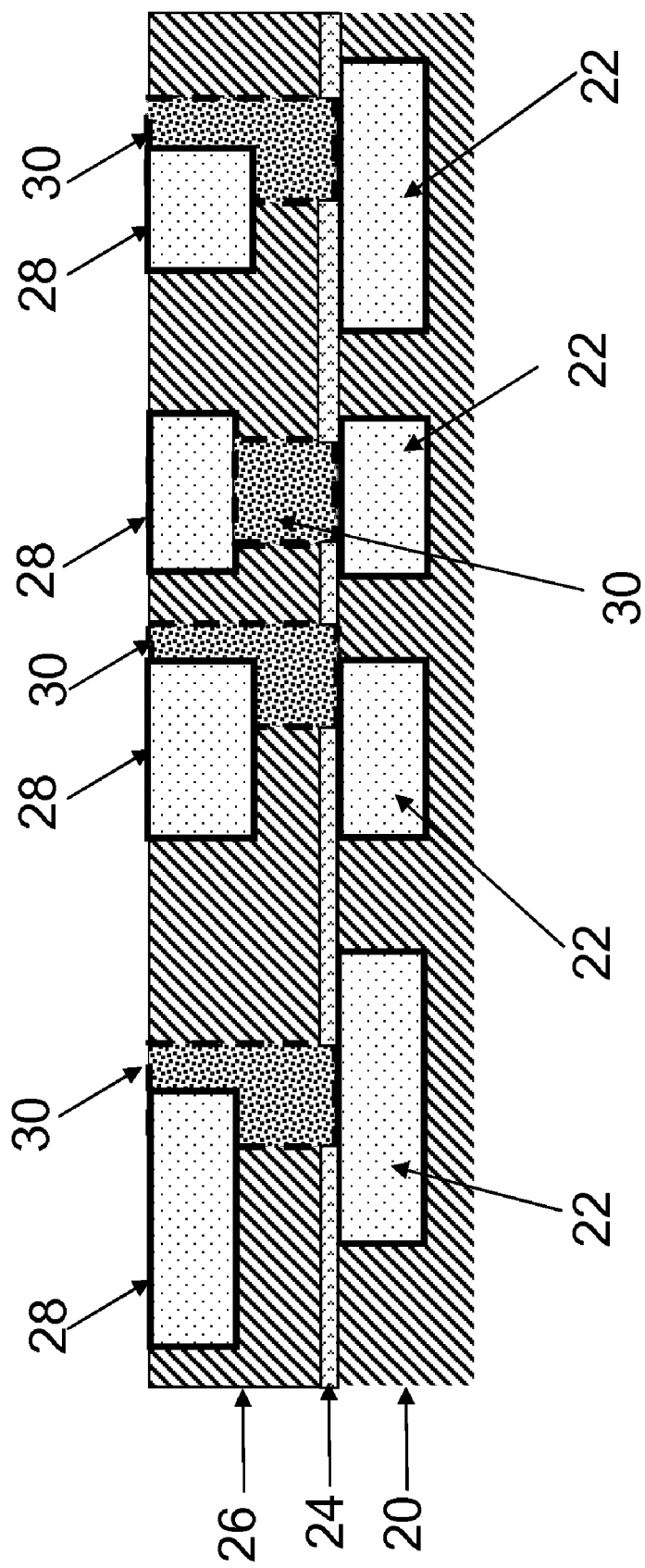
FIGS. 3-8 show the general process flow of forming an electro-static discharge device depicted in FIGS. 1 and 2 according to one embodiment of this disclosure.
Figure 3B:
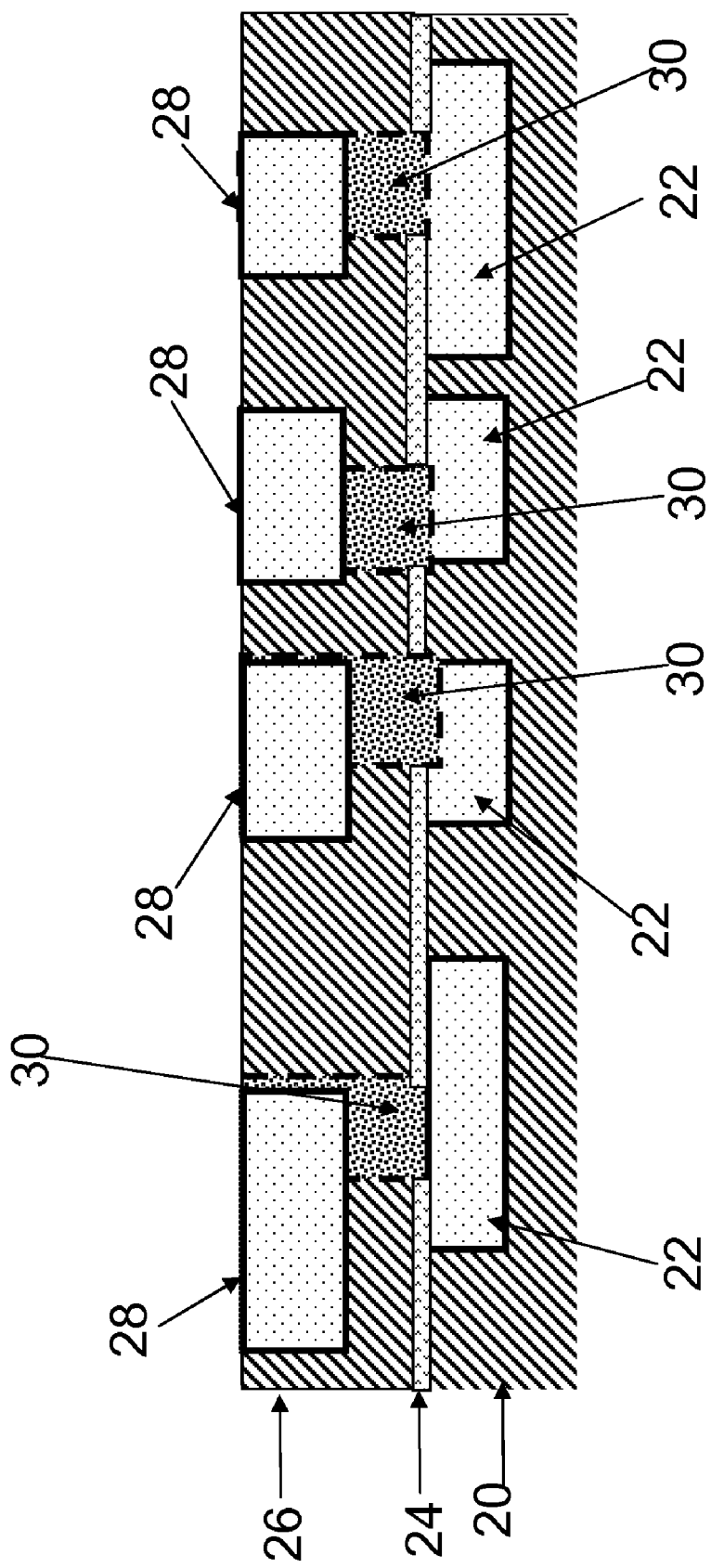
Figure 3C:
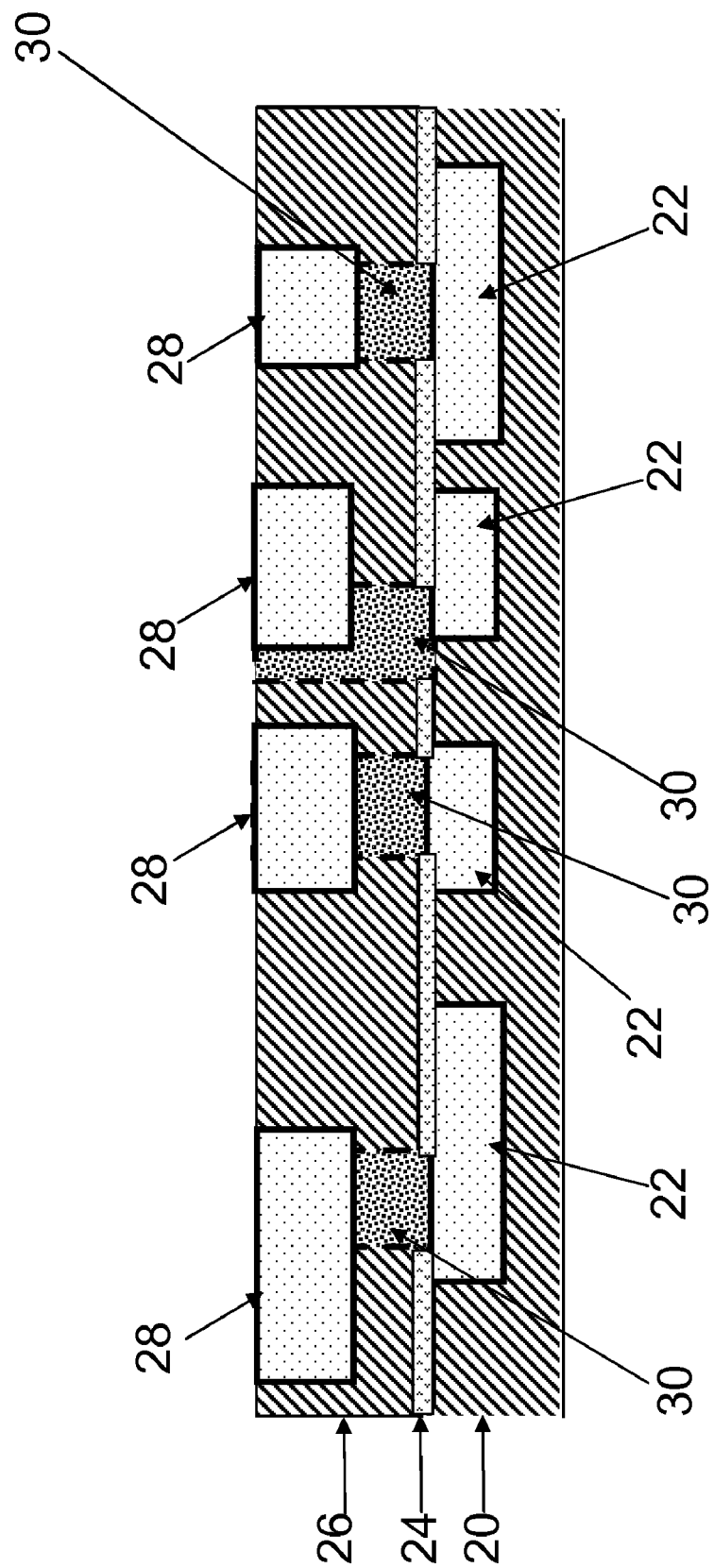

The process starts with an incoming wafer having metal wiring. As shown in FIGS. 3A-3C, the metal wiring in the incoming wafer includes two metal levels. In one metal level there is a first inter-level dielectric (ILD) layer 20 having more than one electrode 22 formed therein and a capping layer 24 deposited on the ILD layer. In the second metal level, there is a second ILD layer 26 with more than one electrode 28 formed therein. A via 30 connects the electrodes 22 in the first ILD layer 20 to the electrodes 28 in the second ILD layer 26. The ILD layers 20 and 26 are any suitable dielectric film that may include organosilicate glass (SiCOH), fluoride silicate glass (FSG) or undoped silicate glass (USG). The electrodes 22 and 28 are a metal such as copper, however, other possible metals such as aluminum or tungsten can be used. The capping layer 24 is a dielectric film that is generally used to prevent oxidation and improve electro-migration. A non-exhaustive listing of materials used for the capping layer 24 may include silicon nitride, silicon carbide, silicon carbon nitride, or other suitable dielectric materials.

FIGS. 3A-3C differ in that the via 30 in each figure is located in a different position with respect to the electrodes 22 and 28. FIG. 3A shows that the via 30 is misaligned to the right of the electrodes. In one embodiment, the misalignment of the via 30 can be about +40 nm. FIG. 3B shows that the via 30 has zero alignment with the electrodes. FIG. 3C shows that the via 30 is misaligned to the left of the electrodes. In one embodiment, the misalignment of the via 30 can be about −40 nm.

Figure 4:
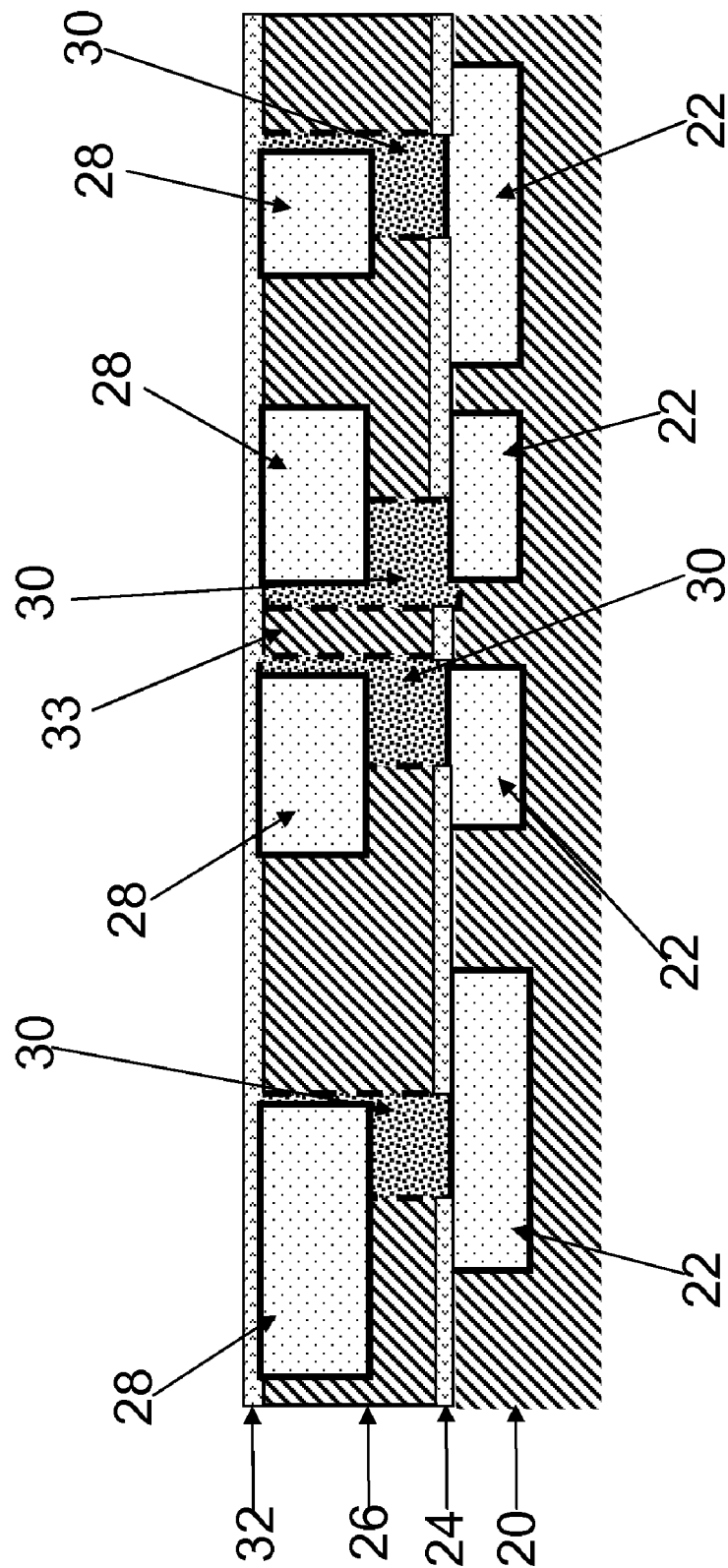

In FIG. 4, a capping layer 32 is deposited on second ILD layer 26 such that this layer covers the electrodes 28. The capping layer 32 may include material such as $Si_3N_4$, SiC, or SiCN. The capping layer 32 is deposited on the second ILD layer 26 using any suitable deposition technique that may include plasma enhanced chemical vapor deposition (PECVD), molecular CVD, atomic layer deposition. Note that in FIG. 4, the two vias 30 in the center of the figure are misaligned with respect to their corresponding electrodes in the first metal level and the second metal level such that a narrow gap 33 is formed therebetween.

Figure 5:
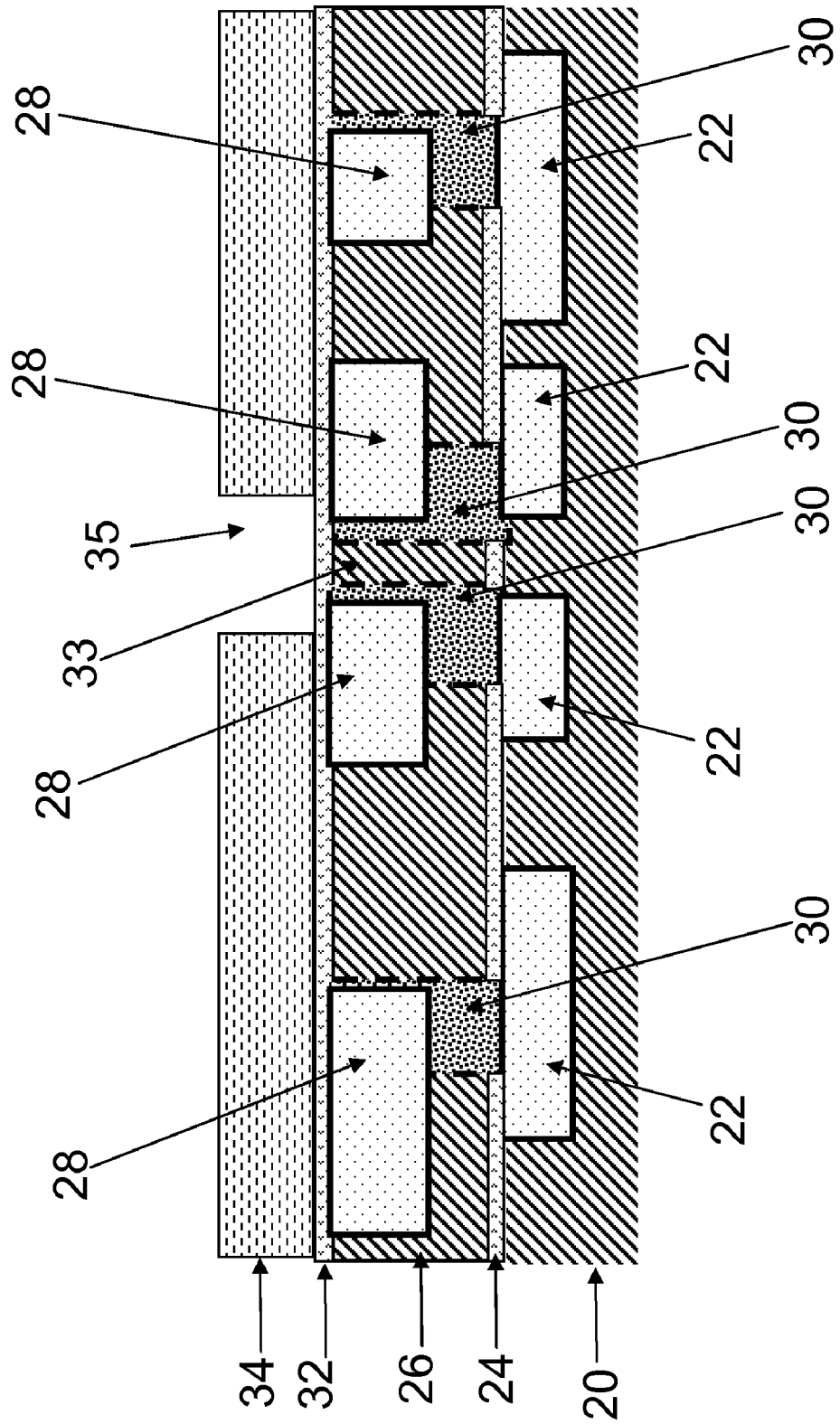

In FIG. 5, a photoresist film 34 is deposited over the capping layer 32. The photoresist film is exposed and developed to form an opening 35 above the narrow gap 33 that separates the misaligned vias.

Figure 6:
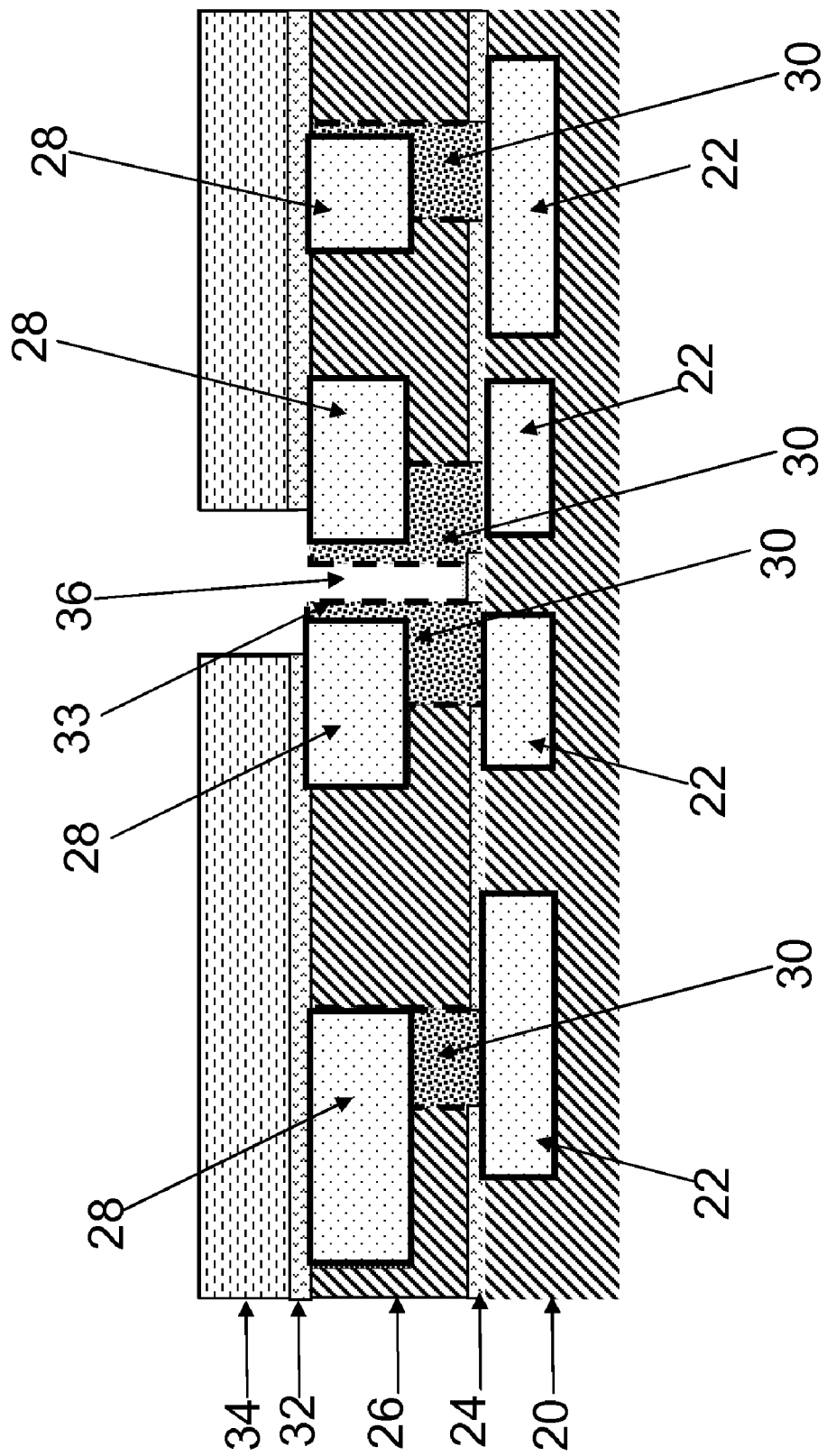

In FIG. 6, the formation of a cavity trench 36 continues through the capping layer 32 and the second ILD layer 26 through the gap 33 to the top surface of capping layer 24. The cavity trench formed through the gap is performed by using a conventional etch. In one embodiment, the etch may include a reactive ion etching (RIE) operation such as a non-selective RIE (non-oxidizing) in conjunction with a reactive resist strip (e.g., $H_2$ or $N_2$) and a defluorination plasma clean operation to remove the remainder of the photoresist film 34.

Figure 7:
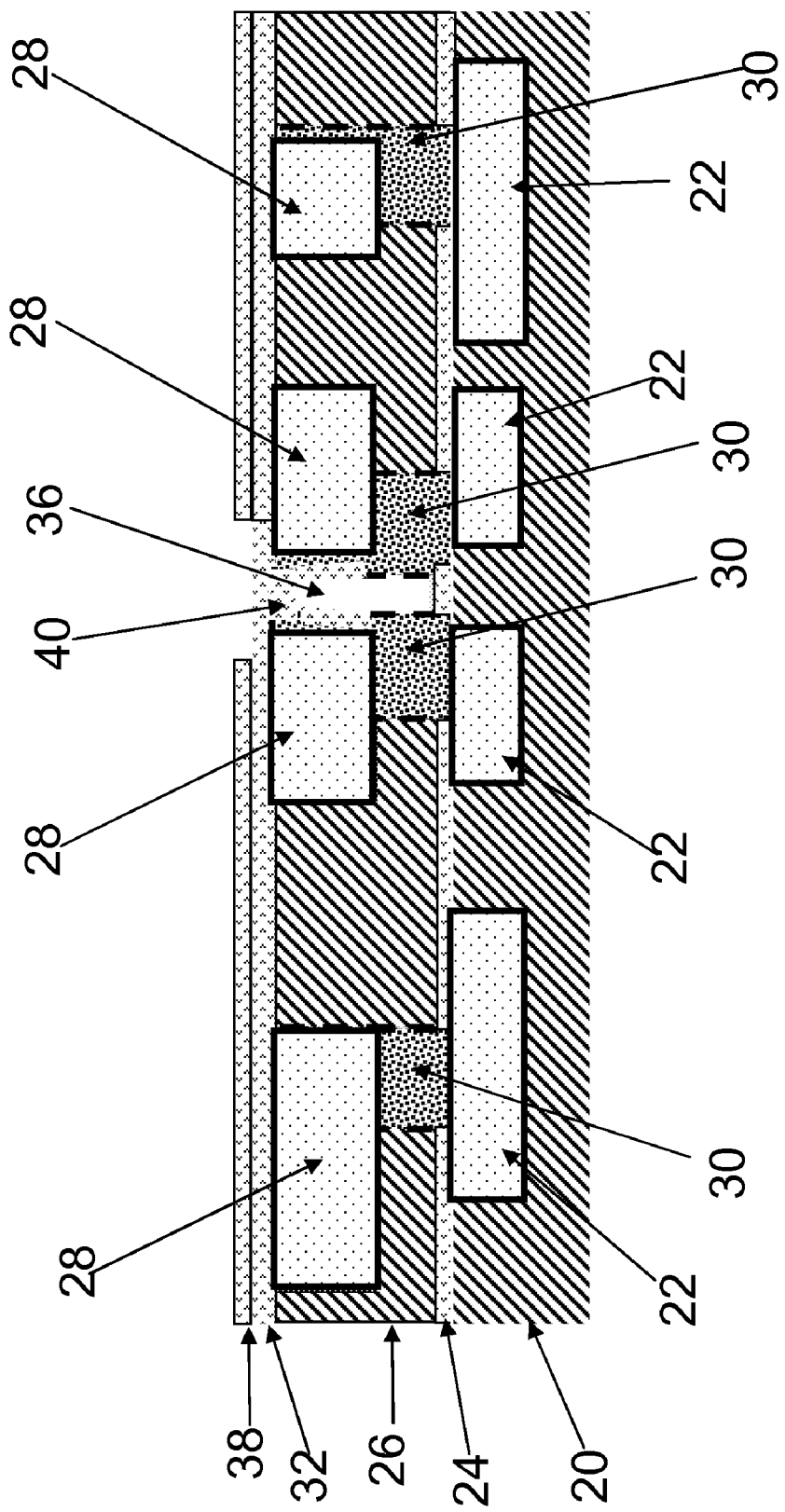

In FIG. 7, a capping layer 38 is deposited over the capping layer 32. As shown in FIG. 7, the capping layer 38 is deposited over the opening in the cavity trench 36. This deposition forms a pinching layer 40 over the opening in the cavity trench 36 with the second ILD 26. As a result, the pinching layer 40 pinches off the opening and creates a high aspect ratio. The capping layer 38 and pinching layer 40 may include material such as $Si_3N_4$, SiC, or SiCN. The capping layer 38 and pinching layer 40 are deposited using any suitable deposition technique that may include plasma enhanced chemical vapor deposition (PECVD), chemical vapor deposition (CVD), molecular CVD, or atomic layer deposition.

Figure 8:
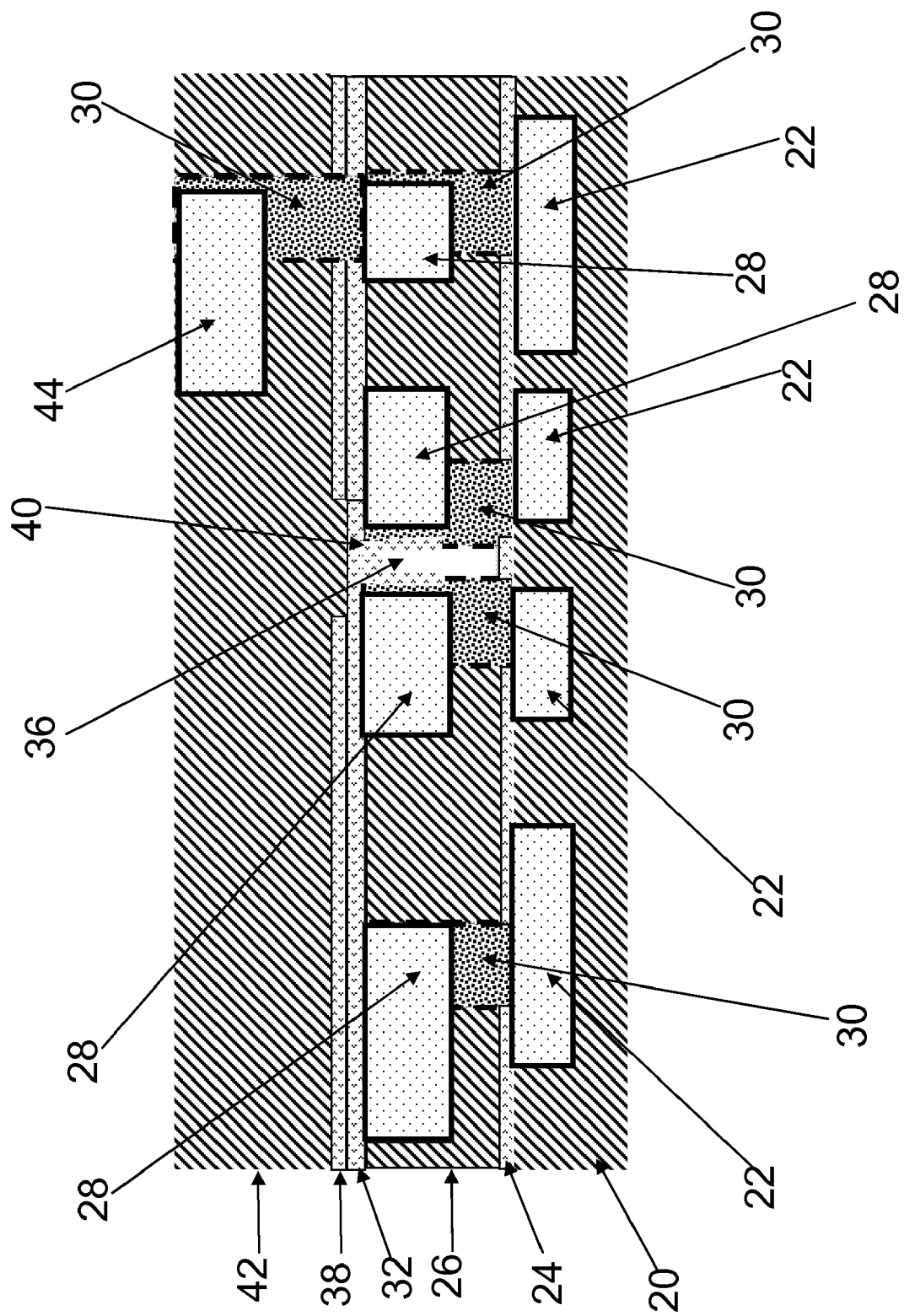

In FIG. 8, a third ILD layer 42 is deposited over the capping layer 38, the pinching layer 40 and the second ILD layer 26. The ILD layer 42 includes an electrode 44 and a via 30 that connects this electrode to electrodes 28 and 22 in the second ILD layer 26 and the first ILD layer 20, respectively. In this implementation, the ILD layer 42 hermetically seals the pinching layer and the cavity trench 36 to provide ESD protection. The ILD layer 42, electrode 44 and connecting via 30 in this level are formed by plasma enhanced chemical vapor deposition (PECVD), or spin-on technique. As with the other metal levels, the third ILD layer 42 may include any suitable dielectric film such as organosilicate glass (SiCOH), fluoride silicate glass (FSG) or undoped silicate glass (USG) and the electrode 44 is a metal that may include copper, aluminum, or tungsten. After forming the ESD device shown in FIG. 8, it is integrated with an integrated circuit by coupling it to the pad of the circuit to provide ESD protection against ESD events.

Figure 9:
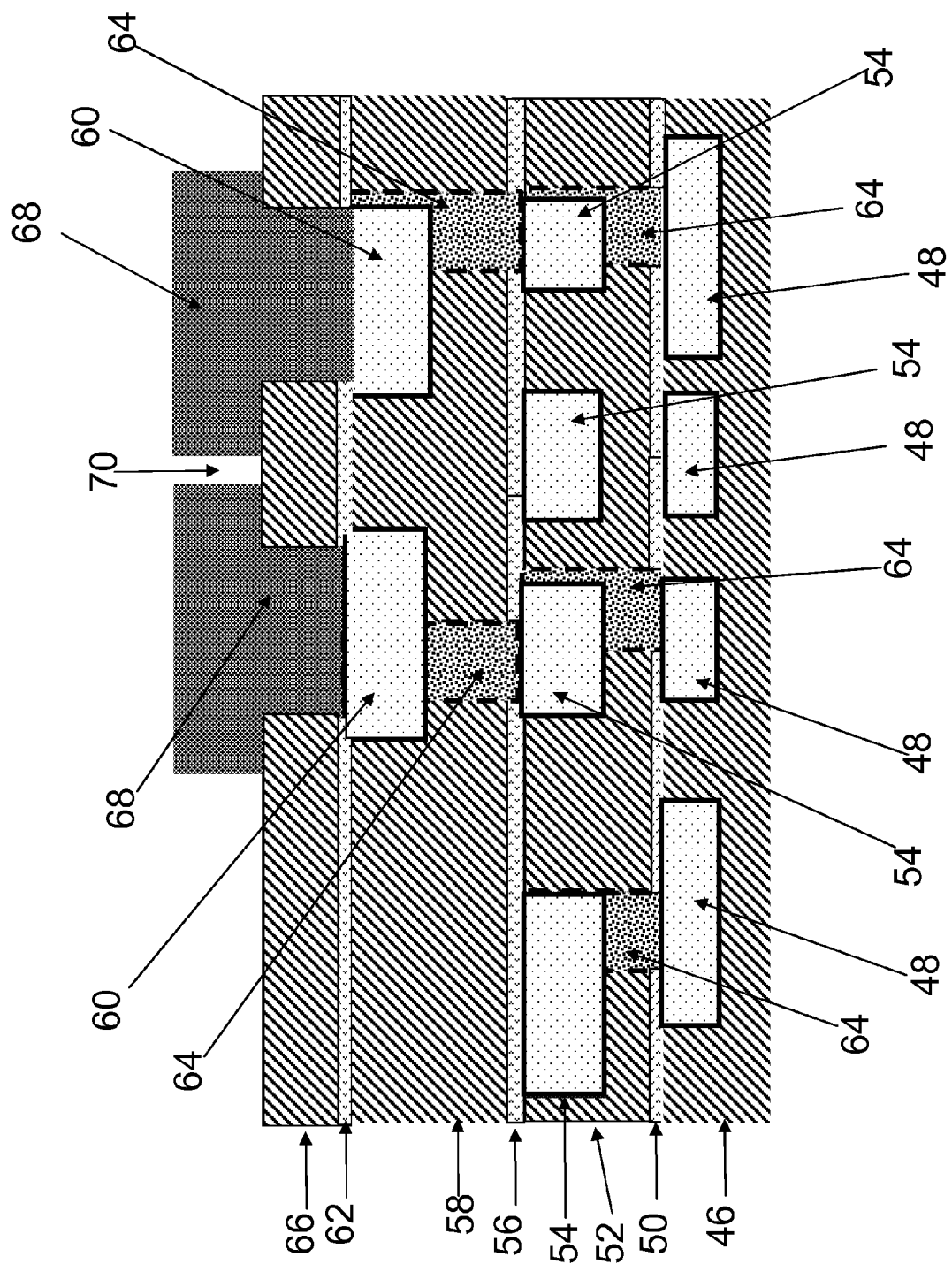
FIGS. 9-10 show the general process flow of forming an electro-static discharge device depicted in FIGS. 1 and 2 according to a second embodiment of this disclosure.
Figure 10:
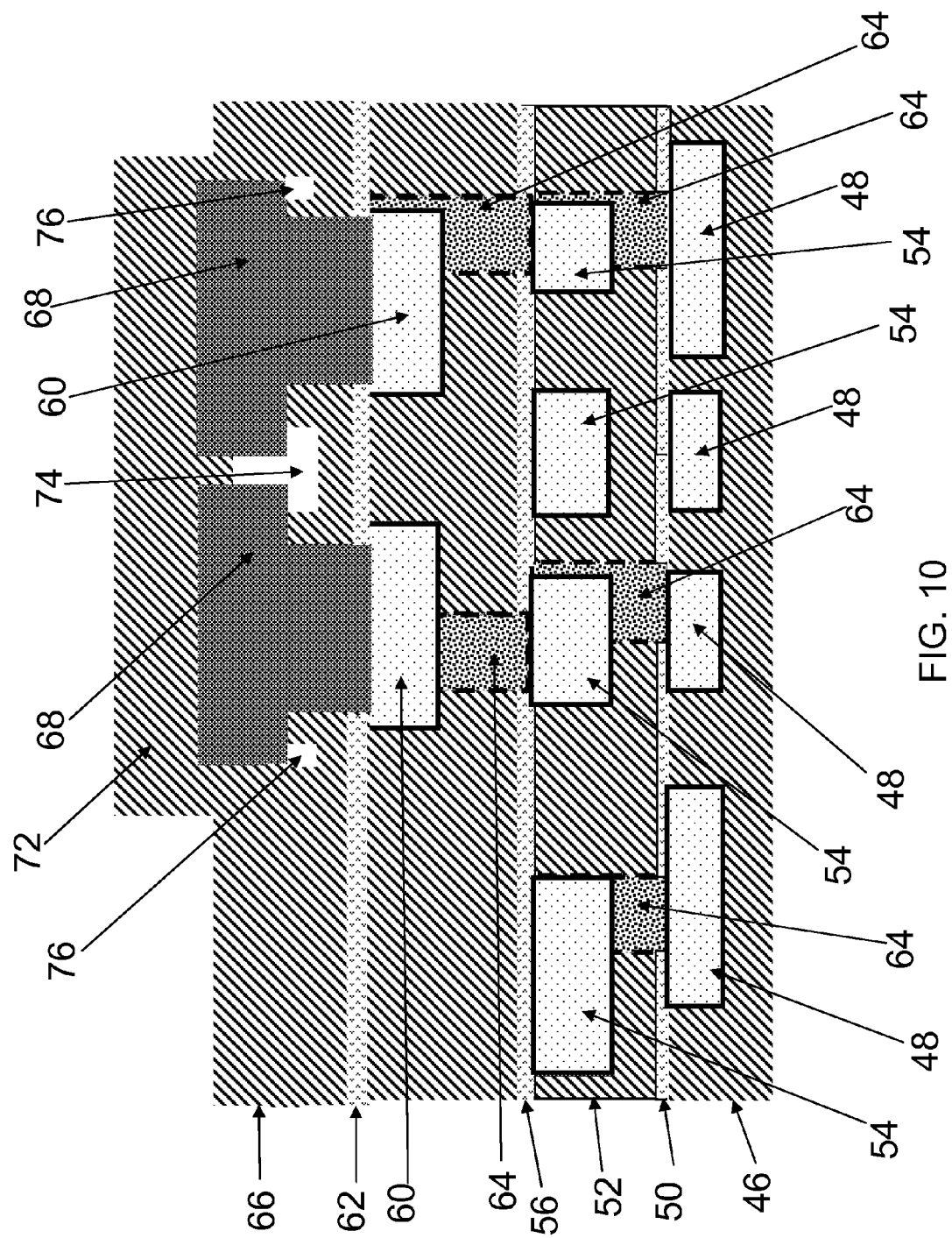

FIGS. 9-10 show the general process flow of forming an ESD device depicted in FIGS. 1 and 2 according to a second embodiment of this disclosure. In particular, FIGS. 9-10 generally pertain to a process of forming ESD device 10 depicted in FIG. 1, however, the description is suitable for fabricating ESD device 19. Those skilled in the art will recognize that forming ESD device 19 will require additional steps to produce the extra tips.

The process starts with an incoming wafer having metal wiring. As shown in FIG. 9, the metal wiring in the incoming wafer includes multiple metal levels. For ease of illustration, FIG. 9 discloses three metal levels, however, those skilled in the art will recognize that more or less metal levels can be used. In one metal level there is a first inter-level dielectric (ILD) layer 46 having more than one electrode 48 formed therein and a capping layer 50 deposited on the ILD layer 46. In a second metal level, there is a second ILD layer 52 with more than one electrode 54 formed therein and a capping layer 56 deposited on the ILD layer 52. In a third metal level, there is a third ILD layer 58 with more than one electrode 60 formed therein and a capping layer 62 deposited on the ILD layer 58. Vias 64 connect some of the electrodes 48 in the first ILD layer 46 to some of the electrodes 54 in the second ILD layer 52 and some of the electrodes 54 in the second ILD layer 52 to electrodes 60 in the third ILD layer 58. As shown in FIG. 9, a fourth ILD layer 66 is deposited over capping layer 62 in FIG. 9. The ILD layers 46, 52, 58 and 66 are any suitable dielectric film that may include organosilicate glass (SiCOH), fluoride silicate glass (FSG) or undoped silicate glass (USG).

The electrodes 48, 54 and 60 are a metal such as copper, however, other possible metals such as aluminum, or tungsten can be used. The capping layers 50, 56 and 62 can by any dielectric film as silicon nitride, silicon carbide, or silicon carbon nitride.

FIG. 9 also shows that the incoming wafer includes at least two last metal electrodes 68 deposited over electrodes 60 in the third ILD layer 58 through the fourth ILD layer 66 and the capping layer 62. The two last metal electrodes 68 are separated by a minimum gap 70 that extends to a top level of the multiple metal layers (i.e., the ILD layer 66). The last metal electrodes 68 comprise an aluminum wire.

In FIG. 10, a passivation layer 72 (e.g., another ILD layer) is deposited over the ILD layer 66 and the two last metal electrodes 68 and in the gap formed therebetween. The passivation layer 72 may include an oxide material, a nitride material, or a combination of $SiO_2$ and $Si_3N_4$. The passivation layer 72 is deposited on the ILD layer 66 using any suitable deposition technique that may include plasma enhanced chemical vapor deposition (PECVD), chemical vapor deposition (CVD), or molecular CVD.

FIG. 10 also shows that a portion of the passivation layer has been removed from the gap 70 separating the two last metal electrodes 68 to form a gap (air-filled or vacuum filled) 74 that provides ESD protection. In one embodiment, the gap 74 is formed by an etching operation such as a wet etch. In another embodiment, a RIE operation can be used to form the gap 74. The formed gap 74 results in a high aspect ratio that in one embodiment is greater than 2:1. FIG. 10 also shows that the etching operation removes a portion of passivation film 72 from underneath each of the last metal electrodes 68 at locations 76, which are also air-filled or vacuum filled. After forming the ESD device shown in FIG. 10, it is integrated with an integrated circuit by coupling it to the pad of the circuit to provide ESD protection against ESD events.

The foregoing processes described in FIGS. 3-10 shows some of the processing functions associated with fabricating the ESD device according to different embodiments. In this regard, each figure represents a process act associated with forming the ESD device according to one of these embodiments. It should also be noted that in some alternative implementations, the acts noted in the figures may occur out of the order noted in the figures or, for example, may in fact be executed in different order, depending on the acts involved. Also, one of ordinary skill in the art will recognize that additional figures that describe the formation of the ESD device may be added for each of these embodiments.

Figure 11:
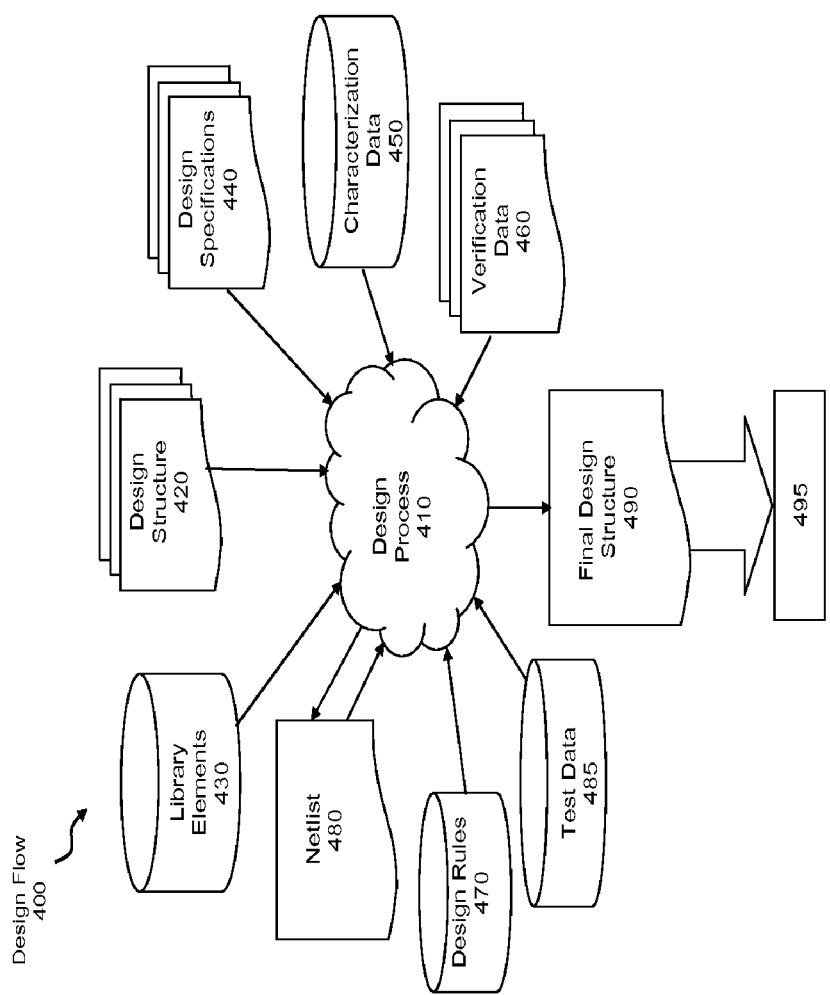
FIG. 11 shows a flow diagram describing a design process that can be used in the semiconductor design, manufacturing and/or test of the structures embodied in this disclosure.

FIG. 11 shows a block diagram of an exemplary design flow 400 used for example, in semiconductor design, manufacturing, and/or test. Design flow 400 may vary depending on the type of IC being designed. For example, a design flow 400 for building an application specific IC (ASIC) may differ from a design flow 400 for designing a standard component. Design structure 420 is preferably an input to a design process 410 and may come from an IP provider, a core developer, or other design company or may be generated by the operator of the design flow, or from other sources. Design structure 420 comprises an embodiment of the aspects shown in FIGS. 1-10 in the form of schematics or HDL, a hardware-description language (e.g., Verilog, VHDL, C, etc.). Design structure 420 may be contained on one or more machine readable medium. For example, design structure 420 may be a text file or a graphical representation of an embodiment of the aspects shown in FIGS. 1-10. Design process 410 preferably synthesizes (or translates) an embodiment of the aspects shown in FIGS. 1-10 into a netlist 480, where netlist 480 is, for example, a list of wires, transistors, logic gates, control circuits, I/O, models, etc. that describes the connections to other elements and circuits in an integrated circuit design and recorded on at least one of machine readable medium. For example, the medium may be a CD, a compact flash, other flash memory, a packet of data to be sent via the Internet, or other networking suitable means. The synthesis may be an iterative process in which netlist 480 is resynthesized one or more times depending on design specifications and parameters for the circuit.

Design process 410 may include using a variety of inputs; for example, inputs from library elements 430 which may house a set of commonly used elements, circuits, and devices, including models, layouts, and symbolic representations, for a given manufacturing technology (e.g., different technology nodes, 32 nm, 45 nm, 90 nm, etc.), design specifications 440, characterization data 450, verification data 460, design rules 470, and test data files 485 (which may include test patterns and other testing information). Design process 410 may further include, for example, standard circuit design processes such as timing analysis, verification, design rule checking, place and route operations, etc. One of ordinary skill in the art of integrated circuit design can appreciate the extent of possible electronic design automation tools and applications used in design process 410 without deviating from the scope and spirit of the disclosure. The design structure of the disclosure is not limited to any specific design flow.

Design process 410 preferably translates aspects shown in FIGS. 1-10, along with any additional integrated circuit design or data (if applicable), into a second design structure 490. Design structure 490 resides on a storage medium in a data format used for the exchange of layout data of integrated circuits and/or symbolic data format (e.g. information stored in a GDSII (GDS2), GL1, OASIS, map files, or any other suitable format for storing such design structures). Design structure 490 may comprise information such as, for example, symbolic data, map files, test data files, design content files, manufacturing data, layout parameters, wires, levels of metal, vias, shapes, data for routing through the manufacturing line, and any other data required by a semiconductor manufacturer to produce aspects shown in FIGS. 1-10. Design structure 490 may then proceed to a stage 495 where, for example, design structure 490: proceeds to tape-out, is released to manufacturing, is released to a mask house, is sent to another design house, is sent back to the customer, etc.

The integrated circuit chips that are integrated with the ESD device described herein can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is apparent that there has been provided by this disclosure a design structure for an on-chip high frequency electro-static discharge device is described. While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. An electro-static discharge protection device fabricated on an integrated circuit, comprising:
a substrate;
multiple metal level layers disposed on the substrate, wherein each metal level layer comprises more than one electrode formed therein and more than one via connecting with some of the electrodes in adjacent metal levels; and
a gap formed about one of the multiple metal level layers, wherein the gap is hermetically sealed to provide electro-static discharge protection for the integrated circuit.

2. The device according to claim 1, wherein the multiple metal level layers comprises a first dielectric layer with more than one electrode formed therein, a second dielectric layer disposed over the first dielectric layer with more than one electrode formed therein and more than one via connecting the more than one electrode in the first dielectric layer to a respective more than one electrode in the second dielectric layer.

3. The device according to claim 2, wherein the more than one via is misaligned a predetermined amount with the more than one electrodes in the first dielectric layer and the second dielectric layer, and wherein at least one of the misaligned vias forms the gap with another misaligned via.

4. The device according to claim 3, further comprising a pinching layer disposed over the gap, wherein the pinching layer pinches off the gap.

5. The device according to claim 4, wherein the gap comprises a high aspect ratio.

6. The device according to claim 4, further comprising a third dielectric layer disposed over the second dielectric layer, wherein the third dielectric layer hermetically seals the pinching layer and the gap to provide electro-static discharge protection.

7. The device according to claim 2, further comprising a first capping layer disposed between the first dielectric layer and the second dielectric layer.

8. The device according to claim 7, further comprising a second capping layer disposed over the second dielectric layer.

9. The device according to claim 1, further comprising an interlevel dielectric layer disposed over the multiple metal level layers and at least two last metal electrodes separated by a predetermined distance that extend through the interlevel dielectric layer to a top level of the multiple metal layers.

10. The device according to claim 9, further comprising a passivation layer disposed over the interlevel dielectric layer and the at least two last metal electrodes and in a region formed therebetween and separated by the predetermined distance.

11. The device according to claim 10, wherein the gap is formed in a portion of the passivation layer separating the at least two last metal electrodes.

12. The device according to claim 11, further comprising a portion of passivation film removed from underneath each of the at least two last metal electrodes outside of the gap.

13. A design structure of an on-chip electro-static discharge protection device embodied in a machine readable medium, the design structure of the electro-static discharge protection device comprising:
a substrate;
multiple metal level layers disposed on the substrate wherein each metal level layer comprises more than one electrode formed therein and more than one via connecting with some of the electrodes in adjacent metal levels; and
a gap formed about one of the multiple metal level layers, wherein the gap is hermetically sealed to provide electro-static discharge protection for the integrated circuit.

14. The design structure according to claim 13, wherein the design structure comprises a netlist.

15. The design structure according to claim 13, wherein the design structure resides on storage medium as a data format used for the exchange of layout data of integrated circuits.

16. The design structure according to claim 13, wherein the design structure comprises a text file or a graphical representation.

17. The design structure according to claim 13, wherein the multiple metal level layers comprises a first dielectric layer with more than one electrode formed therein, a second dielectric layer disposed over the first dielectric layer with more than one electrode formed therein and more than one via connecting the more than one electrode in the first dielectric layer to a respective more than one electrode in the second dielectric layer.

18. The design structure according to claim 17, wherein the more than one via is misaligned a predetermined amount with the more than one electrodes in the first dielectric layer and the second dielectric layer, and wherein at least one of the misaligned vias forms the gap with another misaligned via with a pinching layer disposed over the gap to pinch off the gap.

19. The design structure according to claim 13, further comprising an interlevel dielectric layer disposed over the multiple metal level layers and at least two last metal electrodes separated by a predetermined distance that extend through the interlevel dielectric layer to a top level of the multiple metal layers.

20. The design structure according to claim 19, further comprising a passivation layer disposed over the interlevel dielectric layer and the at least two last metal electrodes and in a region formed therebetween and separated by the predetermined distance.

* * * * *